(12) United States Patent
Petricevic

(10) Patent No.: US 12,137,615 B2
(45) Date of Patent: Nov. 5, 2024

(54) ELECTROMECHANICAL TRANSDUCER WITH A LAYER STRUCTURE

(71) Applicant: INDTact GmbH, Würzburg (DE)

(72) Inventor: Raino Petricevic, Würzburg (DE)

(73) Assignee: iNDTact GmbH, Würzburg (DE)

( * ) Notice: Subject to any disclaimer, the term of this patent is extended or adjusted under 35 U.S.C. 154(b) by 640 days.

(21) Appl. No.: 17/283,810

(22) PCT Filed: Nov. 4, 2019

(86) PCT No.: PCT/EP2019/080081
§ 371 (c)(1),
(2) Date: Apr. 8, 2021

(87) PCT Pub. No.: WO2020/094559
PCT Pub. Date: May 14, 2020

(65) Prior Publication Data
US 2021/0343926 A1    Nov. 4, 2021

(30) Foreign Application Priority Data

Nov. 6, 2018 (DE) .......................... 102018127651.6

(51) Int. Cl.
*H10N 30/88* (2023.01)
*H10N 30/02* (2023.01)
(Continued)

(52) U.S. Cl.
CPC ........... *H10N 30/883* (2023.02); *H10N 30/02* (2023.02); *H10N 30/302* (2023.02); *H10N 30/875* (2023.02)

(58) Field of Classification Search
CPC .... H10N 30/875; H10N 30/02; H10N 30/302; H10N 30/883; H04R 17/025
See application file for complete search history.

(56) References Cited

U.S. PATENT DOCUMENTS

2003/0023270 A1* 1/2003 Danz ................. A61N 1/36021
607/2
2008/0202664 A1  8/2008 Pletner et al.
(Continued)

FOREIGN PATENT DOCUMENTS

CN     104881193 A    9/2015
EP        2372802 A2   10/2011
(Continued)

OTHER PUBLICATIONS

Köpf, Christian; International Search Report; PCT/EP2019/080081; dated Mar. 11, 2020; 7 pages.
(Continued)

*Primary Examiner* — J. San Martin
(74) *Attorney, Agent, or Firm* — Bradley Arant Boult Cummings LLP

(57) ABSTRACT

Electromechanical transducer (1, 21, 28) having a layer structure comprising, in this order: a first layer (2) which has, in at least one plane, at least one outwardly insulated, structured, electrically conductive region (3) acting as an electrical shield, a second layer (6) serving as an adhesive layer, which is electrically conductive at least at certain points, a third layer (13, 22) comprising an electromechanical functional element, a fourth layer (15, 23) serving as an adhesive layer, which is electrically conductive at least at certain points, a fifth layer (17, 24), which has, in at least one plane, at least one outwardly insulated structured electrically conductive region (18) acting as an electrical shield. In addition, a method for manufacturing such an electromechanical transducer (1, 21, 28) is described.

18 Claims, 3 Drawing Sheets

Figure 1:
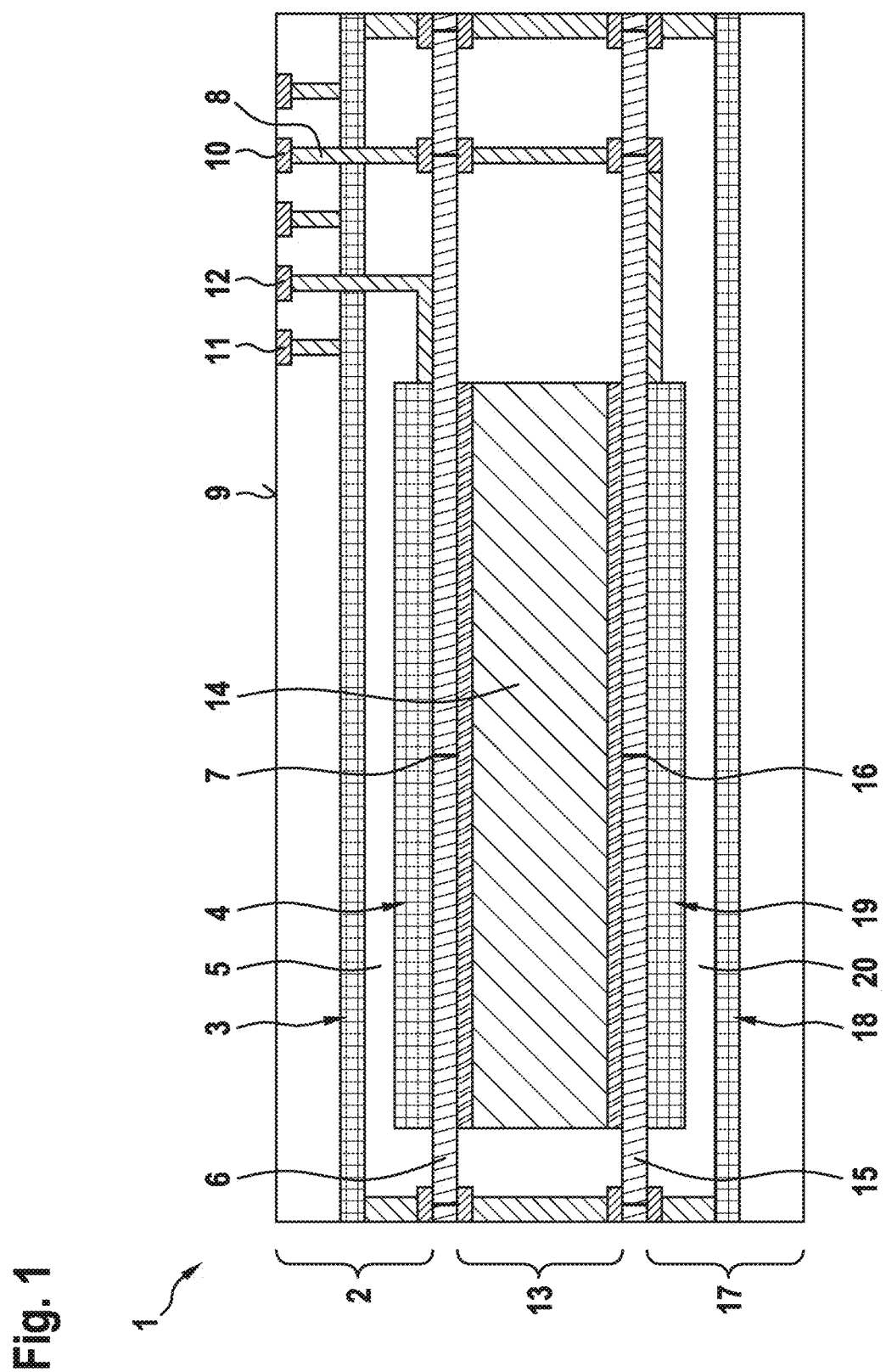

(51) Int. Cl.
   *H10N 30/30*      (2023.01)
   *H10N 30/87*      (2023.01)

(56) References Cited

U.S. PATENT DOCUMENTS

| | | |
|---|---|---|
| 2010/0013352 A1 | 1/2010 | Pletner et al. |
| 2011/0297996 A1 | 12/2011 | van den Brand et al. |
| 2013/0044175 A1 | 2/2013 | Duce et al. |
| 2016/0204333 A1 | 7/2016 | Kondo |
| 2018/0040562 A1 | 2/2018 | Löher et al. |

FOREIGN PATENT DOCUMENTS

| | | |
|---|---|---|
| GB | 2375175 A | 11/2002 |
| JP | H1114478 A | 1/1999 |
| JP | 2003346556 A | 12/2003 |
| JP | 2005175018 A | 6/2005 |
| JP | 2008135886 A | 6/2008 |
| JP | 2013048233 A | 3/2013 |
| WO | WO-2013068726 A2 | 5/2013 |

OTHER PUBLICATIONS

Rajala, Satu, et al.; "Film-Type Sensor Materials PVDF and EMFi in Measurement of Cardiorespiratory Signals—A Review"; IEEE Sensors Journal, vol. 12, No. 3; Mar. 2012; pp. 439-446.

* cited by examiner

ELECTROMECHANICAL TRANSDUCER WITH A LAYER STRUCTURE

The invention relates to an electromechanical transducer having a layered structure.

EP 2 372 802 A2 describes an electromechanical transducer comprising at least a bottom support layer, an electrical and/or electromechanical functional element arranged thereon, and a top layer having electrical contacts connected to the functional element.

For such an electromechanical transducer to be commercially viable, an efficient manufacturing process is required. The invention is therefore based on the object of specifying an electromechanical transducer which is suitable for production on an industrial scale and which operates robustly and reliably. In addition, an associated manufacturing method is to be specified.

To solve this problem, an electromechanical transducer is provided.

The electromechanical transducer according to the invention has a layered structure comprising, in this order:
- a first layer which has, in at least one plane, at least one outwardly insulated structured electrically conductive region acting as an electrical shield,
- a second layer serving as an adhesive layer, which is electrically conductive at least at certain points,
- a third layer comprising an electromechanical functional element,
- a fourth layer serving as an adhesive layer, which is electrically conductive at least at certain points,
- a fifth layer which has, in at least one plane, at least one outwardly insulated structured electrically conductive region acting as an electrical shield.

The electromechanical transducer according to the invention is characterized by the fact that it can be manufactured simply and inexpensively in large quantities due to its layered structure. The outer layers, i.e. the first layer and the fifth layer, serve in particular to shield the electromechanical functional element so that it cannot be disturbed by external influences such as electromagnetic fields. Another advantage is that the electromechanical transducer according to the invention can be manufactured comparatively easily due to the layer structure. In particular, several electromechanical transducers can be manufactured by superimposing the individual layers in a single process by subsequently dividing the layered structure (panel), thereby obtaining the individual transducers.

In the electromechanical transducer according to the invention, the second layer and the fourth layer serve as adhesive layers, which in this way connect the two adjacent layers, i.e. the first layer and the third layer and the third layer and the fifth layer, respectively. It is essential here that both the second layer and the fourth layer are electrically conductive at least at points. In this way, an electrical connection can be achieved across the different layers.

Within the scope of the invention, it may be provided that the first layer and/or the fifth layer has or have a contacting exposed on the outside. The contacting may serve for connecting an electrical connecting element, for example a line. It is also within the scope of the invention that the contacting is formed as a plug or as a socket or as an electronic assembly. If the contacting is integrated in the electromechanical transducer, the electrical connection is particularly simple. For example, the contacting can be designed as in a memory card, for example an SD card, or as in a SIM card for a cell phone.

With particular advantage, it can be provided in the electromechanical transducer according to the invention that each layer has at least one point electrical contact or a through-plating via which the layer is electrically conductively connected to an adjacent layer. In this way, an electrical signal can be transmitted perpendicularly to the layer plane to one or to both outer layers in a single or multiple (redundant) manner.

Preferably, in the electromechanical transducer according to the invention, the second to fifth layers have at least one electrically conductive connection to the first layer directly or indirectly via a layer arranged therebetween. Thus, the contacting preferably arranged on the first layer can be electrically connected to each individual layer, if this is required for the forwarding of a signal or for other reasons.

A particularly robust structure of the electromechanical transducer results when two adjacent layers, preferably all adjacent layers, are materially bonded to each other. This means that all layers are firmly bonded to each other, resulting in a stable structure of the electromechanical transducer.

In a further embodiment of the invention, it may be provided that at least two adjacent layers, preferably all adjacent layers, are bonded to each other by a polymer matrix, for example a resin matrix, in a material-locking and/or form-fitting manner. In particular, the second and fourth layers serving as adhesive layers can also consist of a polymer matrix or have a resin matrix. Alternatively, they may comprise an adhesive film, a thermoplastic film or a liquid or viscous adhesive. In this regard, it may be envisioned that the interfacial bond will bond a polymer surface to a polymer surface. However, it may also be provided that the materially bonded joint bonds a metal surface to a metal surface or that the materially bonded joint bonds a polymer surface to a metal surface. Preferably, at least 20% of the surface area of the electromechanical transducer of the interconnect is formed of polymers, in particular a resin matrix. Alternatively, the material bond may be formed by a resin matrix or a polymer-based adhesive. The adhesive can be adhesive-activated and/or cured by heating, optionally under pressure.

Within the scope of the invention, it may be provided that the functional element is designed as one of the following sensors: piezoelectric sensor, capacitive sensor, inductive sensor, conductivity sensor, resistive sensor, piezoresistive sensor, pyroelectric sensor, position sensor, gyrometer, Hall sensor, magnetometer, radar sensor, proximity sensor. Each of the above sensors can be used for a specific measurement task. For example, the sensors mentioned can be used to detect structure-borne sound, i.e. vibrations of a body or a force, strain or bending. Further quantities can be derived or calculated from these measured values recorded by the sensors. For example, structure-borne sound vibrations can also be detected as an audio signal.

The electromechanical transducer according to the invention may comprise an electronic circuit with one or more of the following components: Signal amplifier, filter, A/D converter, signal processing controller, data memory, wireless data transmission module, wireless power transmission module, ASIC (application specific integrated circuit), DSP (digital signal processor), FPGA (field programmable gate array).

It is also within the scope of the invention that the electromechanical transducer according to the invention has several identical or different layers stacked on top of each other. The order of the layers may be different. For example, the stacked layers may be symmetrically arranged. At least one layer of the electromechanical transducer according to the invention may comprise a fiber-reinforced polymer.

Such fiber-reinforced polymers are particularly easy to assemble into a layered structure. The adhesive layer of the electromechanical transducer according to the invention may be electrically insulating, at least in sections. An electrically conductive compound may be formed, for example, by an electrically conductive polymer having, for example, carbon fibers or silver particles as components. The electrical conductivity may also be present only at points, perpendicular to the layer plane, while the adhesive layer is insulated in the plane.

Within the scope of the invention, it is possible to integrate one or more functional layers directly into the electromechanical transducer. Such a layer may include an electronic component, a sensor or another sensor, for example a temperature sensor, a position sensor, a torque sensor, an acceleration sensor, or one or more of the electronic circuits mentioned above. Such sensors and circuits can be easily and inexpensively connected by the invention. It is also possible to integrate a printed circuit board fully equipped with electronic components into the transducer according to the invention.

In the electromechanical transducer according to the invention, at least one layer may be thermally curable or cured or self-adhesive. Furthermore, it is possible for the electromechanical transducer to have multiple layers comprising an electromechanical functional element. Preferably, at least one layer of the electromechanical transducer comprises a fiber-reinforced polymer. Preferably, the adhesive layer is electrically insulating at least in sections and/or parallel to a plane defined by the adhesive layer.

Besides, the invention relates to a method of manufacturing an electromechanical transducer, comprising the following steps:

Providing a first layer having, in at least one plane, at least one outwardly insulated, patterned, electrically conductive region acting as an electrical shield, providing a second layer serving as an adhesive layer, which is electrically conductive at least at certain points, providing a third layer comprising an electromechanical functional element, providing a fourth layer serving as an adhesive layer, which is electrically conductive at least at certain points, providing a fifth layer having, in at least one plane, at least one outwardly insulated, patterned, electrically conductive region acting as an electrical shield.

stacking and aligning the first through fifth layers to form a panel area, pressing the layers under pressure, and dividing the panel area.

In the process according to the invention, it can be provided that the layers are pressed together with the addition of heat. In particular, the layers can be pressed together for a few minutes or a few seconds, or preferably only for fractions of a second.

Within the scope of the process, it may be provided that at least one layer is subjected to cleaning or surface activation prior to pressing. Surface activation can take the form of plasma treatment.

In the process according to the invention, a cold-curing adhesive, a thermoplastic hot-melt adhesive or a duromer structural adhesive can be used as the adhesive layer.

Figure 2:
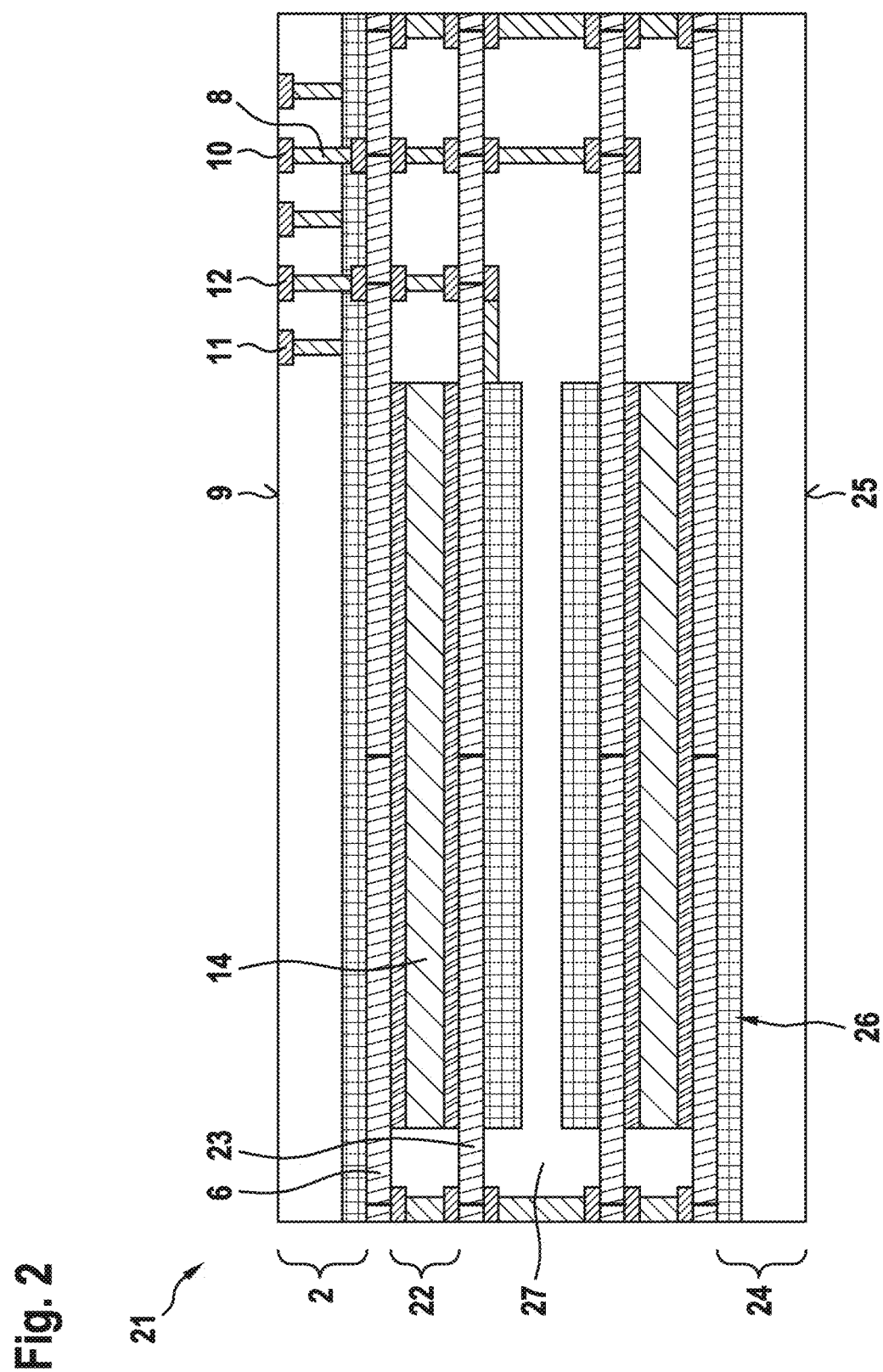
Figure 3:
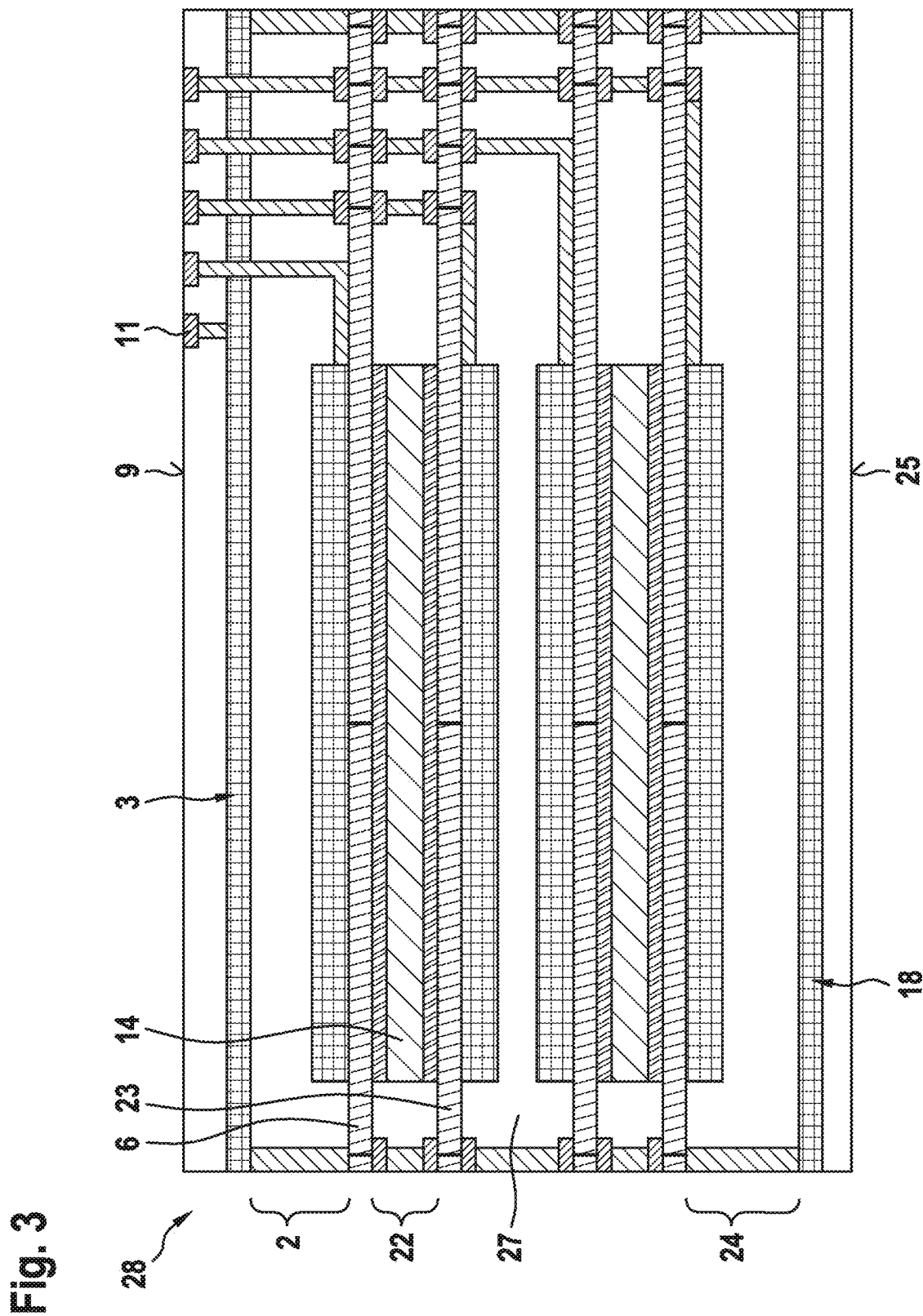

Further advantages and details of the invention are explained below by means of examples with reference to the drawings. The drawings are schematic representations and show:

FIG. 1 a sectional view of a first embodiment of an electromechanical transducer according to the invention, FIG. 2 a second embodiment of an electromechanical transducer according to the invention, and FIG. 3 a third embodiment of an electromechanical transducer according to the invention.

FIG. 1 is a sectional view and shows an electromechanical transducer 1 with a layered structure. The electromechanical transducer 1 comprises a first layer 2, which has in at least one plane at least one outwardly insulated, structured, electrically conductive region 3 acting as an electrical shield. The planar region 3 forms an outer layer that is electrically insulated from the outside of the electromechanical transducer 1. In addition, the first layer 2 comprises another planar region 4 spaced from the planar region 3. The two planar regions 3, 4 are embedded in a polymer matrix 5 and are thereby materially bonded to one another.

The first layer 2 is followed by a second layer 6, which serves as an adhesive layer. The adhesive layer is electrically conductive at various points 7. At each of these points 7 there is an electrical contact transverse to the adhesive layer, i.e. from one side of the adhesive layer to the opposite side. From the second layer 6 serving as the adhesive layer, a contacting 8 extends perpendicular to the layer plane to the outer side 9 of the electromechanical transducer 1. The contacting 8 terminates there in a contact 10. In FIG. 1, it can be seen that further contacts are present on the outer side 9. Several contacts 11 extend to the flat area 3. A contact 12 connects the outside 9 with the flat area 4.

In the view of FIG. 1, a third layer 13 comprising an electromechanical functional element is located underneath the second layer 6, which serves as an adhesive layer. In the embodiment shown, the electromechanical functional element is designed as a piezoelectric sensor 14. The sensor 14 makes use of the piezoelectric effect. When a mechanical pressure is applied, an electric charge is generated, which can be supplied to an amplifier. Subsequently, the signal supplied by the piezoelectric sensor 14 can be processed and evaluated.

Below the third layer 13, in the view of FIG. 1, there is a fourth layer 15 serving as an adhesive layer, which is constructed in the same way as the layer 6 serving as an adhesive layer. The layer 15 serving as an adhesive layer is electrically conductive at points. For this purpose, contacts are provided at several points 16 which penetrate the adhesive layer. The layer 15 serving as the adhesive layer connects the third layer 13 and a fifth layer 17. The fifth layer 17 is basically constructed like the first layer 2. It comprises an outwardly insulated, structured, electrically conductive region 18 in one plane. In addition, the fifth layer 17 comprises a further plane region 19 which is spaced from the plane region 18 in the thickness direction. The two planar regions 18, 19 are—analogously to the planar regions 3, 4 of the first layer 2—embedded in a polymer matrix 20.

From the contact 10 on the outside 9, the contact 8 extends through the second layer 6, which serves as an adhesive layer, and the fourth layer 15, which serves as an adhesive layer, to the fifth layer 17, which is connected to the contact 10 in this way. The various contacts serve to electrically contact the electromechanical transducer 1 with external components, for example with an amplifier or with an evaluation circuit.

The total of five layers of the electromechanical transducer 1 consist of a polymer or a fiber-reinforced polymer, with electrically conductive or electrically insulating regions being provided in the layer as required. Each layer has at least one electrically conductive contact, at least at points, or a two-dimensional contact or a through-plating, via which the respective layer is connected to one or more adjacent layers.

The electromechanical transducer described in this embodiment can be easily manufactured in large quantities using an automated process. For this purpose, a panel is produced comprising a plurality of electromechanical transducers arranged in rows and columns. After stacking the individual layers, compression molding is performed. The panel is then cut up, creating the individual electromechanical transducers.

FIG. 2 shows a second embodiment of an electromechanical transducer 21, which is constructed similarly to the transducer described in the first embodiment. A detailed description of corresponding components is therefore omitted here.

The electromechanical transducer 21 comprises the first layer 2 with the planar area 3, which is insulated from the outside, structured and electrically conductive and serves as an electrical shield. This is followed by the second layer 6, which serves as an adhesive layer. A third layer 22 comprises an electromechanical functional element designed as a sensor 14. A fourth layer 23, which is located on the side of the third layer 22 opposite the layer 6 in the view of FIG. 2, serves as an adhesive layer.

A fifth layer 24 forms an outer side 25 opposite the outer side 9. The fifth layer 24 comprises an outwardly insulated, structured, electrically conductive region 26 acting as an electrical shield. In FIG. 2, it can be seen that the electromechanical transducer 21 is symmetrically constructed. Accordingly, two identical sensors 14 are present, each of which is provided with an adhesive layer on both sides. The fifth layer 24 adjoins the adhesive layer of the lower sensor in FIG. 2. An intermediate layer 27 is located between the two inner adhesive layers.

FIG. 3 shows another embodiment of an electromechanical transducer 28 that is similar in construction to the electromechanical transducer shown in FIG. 2, and also has similar shielding to the embodiment shown in FIG. 1.

LIST OF REFERENCE SIGNS 1 electromechanical transducer
2 first layer
3 planar region
4 planar region
5 polymer matrix
6 second layer
7 point
8 contacting
9 exterior
10 contact
11 contact
12 contact
13 third layer
14 sensor
15 fourth layer
16 point
17 fifth layer
18 planar region
19 planar region
20 polymer matrix
21 electromechanical transducer
22 third layer
23 fourth layer
24 fifth layer
25 outer side
26 region
27 intermediate layer
28 electromechanical transducer

The invention claimed is:

1. An electromechanical transducer having a layered structure comprising in this order:
   a first layer which has, in at least one plane, at least one outwardly insulated, structured, electrically conductive region acting as an electrical shield;
   a second layer serving as an adhesive layer, which is electrically conductive at least at certain points;
   a third layer comprising a piezoelectric sensor that generates a signal responsive to mechanical pressure;
   a fourth layer serving as an adhesive layer, which is electrically conductive at least at certain points;
   a fifth layer comprising a piezoelectric sensor that generates a signal responsive to mechanical pressure;
   a sixth layer which has, in at least one plane, at least one outwardly insulated structured electrically conductive region acting as an electrical shield, wherein at least one of the first layer and the sixth layer has a contact exposed on the outside.

2. The electromechanical transducer according to claim 1, wherein the contacting is designed as a component selected from the group consisting of a plug, a socket, and an electronic unit.

3. The electromechanical transducer according to claim 1, wherein each layer has at least one contact which is electrically conductive at least at points or a through-plating via which the layer is electrically conductively connected to an adjacent.

4. The electromechanical transducer according to claim 1, wherein the second to sixth layers have at least one electrically conductive connection to the first layer, either directly or via a layer arranged in between.

5. The electromechanical transducer according to claim 1, wherein two adjacent layers are bonded to one another in a material-to-material bond.

6. The electromechanical transducer according to claim 5, wherein at least two adjacent layers are bonded to one another by a polymer matrix in at least one of a material-locking and a form-fitting manner.

7. The electromechanical transducer according to claim 5, wherein the material bond is formed on at least 20% of the surface of the electromechanical transducer from polymers.

8. The electromechanical transducer according to claim 5, wherein all adjacent layers are bonded to one another in a material-to-material bond.

9. The electromechanical transducer according to claim 6, wherein all layers are bonded to one another by a polymer matrix in at least one of a material-locking and a form-fitting manner.

10. The electromechanical transducer according to claim 1, wherein the electronic circuit comprises at least one of the following components: signal amplifier, filter, A/D converter, control unit for signal processing, data memory, wireless data transmission module, module for wireless transmission of power, ASIC (application specific integrated circuit), DSP (digital signal processor), and FPGA (field programmable gate array).

11. The electromechanical transducer according to claim 1, wherein at least one layer is thermally curable or cured or self-adhesive.

12. The electromechanical transducer according to claim 1, wherein at least one layer comprises a fiber-reinforced polymer.

13. The electromechanical transducer according to claim 1, wherein the adhesive layer is electrically insulating at least one of in sections and parallel to a plane defined by the adhesive layer.

14. A method of manufacturing an electromechanical transducer, the method comprising the following steps:
   providing a first layer which has, in at least one plane, at least one outwardly insulated, structured, electrically conductive region acting as an electrical shield;
   providing a second layer serving as an adhesive layer, which is electrically conductive at least at points;
   providing a third layer comprising a piezoelectric sensor that generates a signal responsive to mechanical pressure;
   providing a fourth layer serving as an adhesive layer, which is electrically conductive at least at certain points;
   providing a fifth layer comprising a piezoelectric sensor that generates a signal responsive to mechanical pressure;
   providing a sixth layer having in at least one plane at least one outwardly insulated, patterned, electrically conductive region acting as an electrical shield;
   stacking and aligning the first through sixth layers to form a panel area;
   pressing the layers under pressure; and
   dividing the panel area.

15. The method according to claim 14, wherein the layers are pressed together with the application of heat.

16. The method according to claim 14, wherein the layers are pressed together for fractions of a second.

17. The method according to claim 14, wherein at least one layer is subjected to cleaning or surface activation prior to pressing.

18. The method according to claim 14, wherein an adhesive selected from the group consisting of a cold-curing adhesive, a thermoplastic hot-melt adhesive, and a duromer structural adhesive is used as the adhesive layer.

* * * * *